US008395468B2

(12) United States Patent
Stephenson et al.

(10) Patent No.: US 8,395,468 B2
(45) Date of Patent: Mar. 12, 2013

(54) HIGH FIELD STRENGTH MAGENTIC FIELD GENERATION SYSTEM AND ASSOCIATED METHODS

(75) Inventors: James C. Stephenson, Salt Lake City, UT (US); Bruce K. Gale, Taylorsville, UT (US); Cynthia Furse, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 688 days.

(21) Appl. No.: 12/159,927

(22) PCT Filed: Jan. 4, 2007

(86) PCT No.: PCT/US2007/000217
§ 371 (c)(1),
(2), (4) Date: Jun. 10, 2009

(87) PCT Pub. No.: WO2007/117335
PCT Pub. Date: Oct. 18, 2007

(65) Prior Publication Data
US 2009/0302984 A1      Dec. 10, 2009

Related U.S. Application Data

(60) Provisional application No. 60/756,592, filed on Jan. 4, 2006.

(51) Int. Cl.
*H01F 7/02* (2006.01)
(52) U.S. Cl. ......... 335/306; 335/302; 335/216; 600/410
(58) Field of Classification Search ................. 335/216, 335/296–306; 324/318–320; 600/410, 415
See application file for complete search history.

(56) References Cited

U.S. PATENT DOCUMENTS

| 3,460,083 A | 8/1969 | Johnson |
| 3,860,895 A | 1/1975 | Chow et al. |
| 4,381,490 A * | 4/1983 | Peters ........................... 335/210 |

(Continued)

FOREIGN PATENT DOCUMENTS

| JP | 06-302428 | 10/1994 |
| JP | 2001-291600 | 10/2001 |

(Continued)

OTHER PUBLICATIONS

Stephenson, James et al., Table Top Micro Fluidic Nuclear Magnetic Resonance Spectrometer; Abstract submission form, 2006 National Radio Science Meeting. Abstract: furse4462. accessed Jan. 2, 2006. 1 page.

*Primary Examiner* — Bernard Rojas
(74) *Attorney, Agent, or Firm* — Thorpe North & Western LLP

(57) ABSTRACT

A magnetic field generation system includes first (28*a*) and second (28*b*) magnetic flux concentrators spaced apart to form a sample volume (30). A first set of auxiliary permanent magnets (10*a*, 10*b*) can be symmetrically oriented about and in contact with a portion of the first magnetic flux concentrator (28*a*). Similarly, a second set of auxiliary permanent magnets (10*c*, 10*d*) can be symmetrically oriented about and in contact with a portion of the second magnetic flux concentrator (28*b*). The first(10*a*, 10*b*) and second (10*c*, 10*d*) sets of auxiliary magnets can be magnetically associated via the first (28*a*) and second (28*b*) magnetic flux concentrators. Magnetically soft shunts (38) can be movably oriented to allow variation of the magnetic field strength across the sample volume by disrupting the field flux across the magnetic flux concentrators.

18 Claims, 8 Drawing Sheets

U.S. PATENT DOCUMENTS

| | | | |
|---|---|---|---|
| 4,549,155 A | 10/1985 | Halbach | |
| 4,672,346 A | 6/1987 | Miyamoto et al. | |
| 4,675,609 A | 6/1987 | Danby et al. | |
| 4,777,464 A | 10/1988 | Takabatashi et al. | |
| 4,937,545 A | 6/1990 | Chaillout et al. | |
| 4,968,915 A | 11/1990 | Wilson et al. | |
| 5,134,374 A | 7/1992 | Breneman et al. | |
| 5,412,365 A | 5/1995 | Abele et al. | |
| 5,462,054 A | 10/1995 | Rapoport et al. | |
| 5,467,769 A | 11/1995 | Yoshino et al. | |
| 5,798,679 A | 8/1998 | Pissanetzky | |
| RE36,782 E | 7/2000 | Brown et al. | |
| 6,281,775 B1 | 8/2001 | Rapoport | |
| 6,573,817 B2 * | 6/2003 | Gottschalk | 335/306 |
| 6,598,621 B1 | 7/2003 | Wygnanski | |
| 6,670,877 B2 | 12/2003 | Rapoport | |
| 6,680,663 B1 | 1/2004 | Lee et al. | |
| 6,822,452 B2 | 11/2004 | Ham et al. | |
| 6,946,938 B1 | 9/2005 | Pedersen | |
| 7,154,272 B2 * | 12/2006 | Goto et al. | 324/319 |
| 7,196,601 B1 * | 3/2007 | Gottschalk | 335/217 |
| 7,268,553 B1 * | 9/2007 | Damadian et al. | 324/318 |
| 7,423,431 B2 * | 9/2008 | Amm et al. | 324/319 |
| 2003/0003788 A1 * | 1/2003 | Schoepf et al. | 439/181 |
| 2004/0066194 A1 | 4/2004 | Slade et al. | |

FOREIGN PATENT DOCUMENTS

JP   2004-358097   12/2004

* cited by examiner

--Prior Art--

--Prior Art--

--Prior Art--

HIGH FIELD STRENGTH MAGENTIC FIELD GENERATION SYSTEM AND ASSOCIATED METHODS

RELATED APPLICATIONS

This application claims the benefit of U.S. Provisional Application Ser. No. 60/756,592 filed on Jan. 4, 2006, which is incorporated herein by reference.

FIELD OF THE INVENTION

The present invention relates generally to devices and methods for generating a magnetic field. Accordingly, the present application involves the fields of physics, magnetism, and material science.

BACKGROUND OF THE INVENTION

Generation of magnetic fields can be split up into two methods, permanent magnets and electromagnets, including superconducting magnets. For Nuclear Magnetic Resonance Spectroscopy (other applications as well, such as semiconductor characterization), it is desired that as high a static magnetic field be present as possible because signal strength is proportional to the field strength. While superconducting magnets can generate field strengths up to 20 Tesla, they are extremely expensive and large in size. Further, superconducting magnets typically require a super-cooled environment, e.g. about 4.2 K using liquid helium. Electromagnets can be made quite small, but to obtain large fields, a great deal of current must be used. With large currents, excessive heat can be generated in the windings. This heat generation can adversely affect NMR devices because the nuclear magnetic signal is inversely proportional to temperature. Additionally, electromagnets must be driven by an electrical power source.

As such, systems and materials capable of achieving high magnetic field strengths which are relatively inexpensive and suitable for use in practical applications continue to be sought through ongoing research and development efforts.

SUMMARY OF THE INVENTION

In one embodiment, a magnetic field generation system can comprise first and second magnetic flux concentrators each spaced apart to form a sample volume. The first and second magnetic flux concentrators can be formed of a material having a known magnetic field saturation. A first set of auxiliary permanent magnets can be symmetrically oriented about a portion of the first magnetic flux concentrator and can be in substantial contact with the first magnetic flux concentrator. Similarly, a second set of auxiliary permanent magnets can be symmetrically oriented about a portion of the second magnetic flux concentrator and can be in substantial contact with the second magnetic flux concentrator. Generally, the first set and second set of auxiliary permanent magnets can be remote from the sample volume. Each of the first set and second set of auxiliary permanent magnets can be oriented in a magnetically repulsive orientation with respect to at least one other member of their respective sets. The first and second sets of auxiliary magnets can also be magnetically associated via the first and second magnetic flux concentrators.

The present invention can further be configured to allow variation of the magnetic field strength across the sample volume by disrupting the field flux across the magnetic flux concentrators. This can be accomplished by orienting one or more magnetically soft shunts in a sufficient proximity to at least one of the magnetic flux concentrators. For example, the magnetic field generation system can include a first and a second magnetically soft shunt each movably oriented above and below the first and second magnetic flux concentrators respectively. These shunts can be oriented such that a first distance between each of the first magnetically soft shunt and the first magnetic flux concentrator, and second distance between each of the second magnetically soft shunt and the second magnetic flux concentrator can be varied to effect a change in magnetic field strength across the sample volume.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

Figure 1:
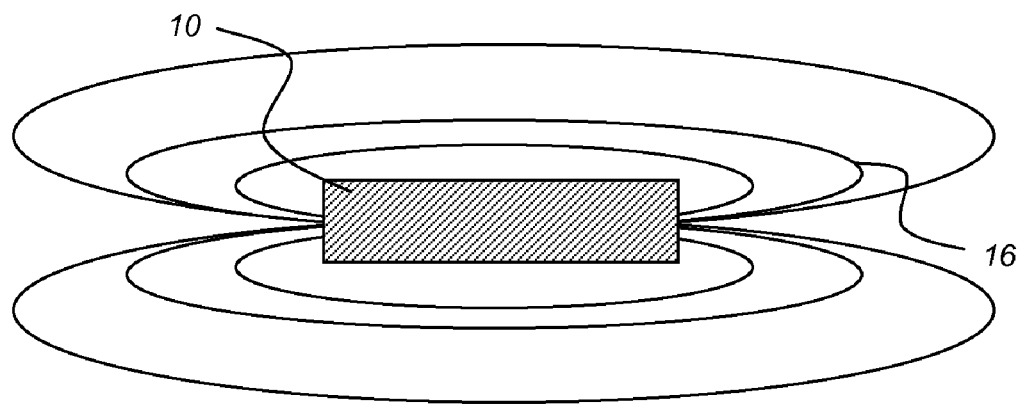
FIG. 1 shows a simple bar magnet and associated field lines in accordance with well known prior art.

The drawings will be described further in connection with the following detailed description. Further, these drawings are not necessarily to scale and are by way of illustration only such that dimensions and geometries can vary from those illustrated.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an," and "the" include plural referents unless the context clearly dictates otherwise. Thus, for example, reference to "a magnet" includes one or more of such magnets, reference to "a set" includes reference to one or more of such sets, and reference to "associating" includes reference to one or more of such steps.

Definitions

In describing and claiming the present invention, the following terminology will be used in accordance with the definitions set forth below.

As used herein, "permanent magnets" refers to materials having a permanent magnetic dipole, as opposed to electromagnets or superconducting magnets which require either an electrical current and/or super-cooled conditions, e.g. about 4.2 K, in order to maintain a magnetic field or diamagnetic and paramagnetic materials having a temporary induced magnetic dipole. Typical permanent magnets include metals such as, but not limited to, Fe, Nd, Mn, Ni, Zn, B, and combinations or alloys of these materials.

As used herein, "magnetic field saturation" or "saturation magnetization" refers to the maximum theoretical magnetic field strength for a given material, i.e. when all magnetic dipoles within the material are aligned with an external magnetic field. Typically, materials will exhibit maximum field strengths slightly lower than theoretical because of material impurities, non-homogeneous domains, or other irregularities.

As used herein, "magnetically associated" refers to magnetic materials which are oriented such that opposing poles of neighboring materials are aligned and the respective magnetic fields are also aligned. When materials are magnetically associated, a portion of the magnetic flux passes through each material. Further, magnetic association does not require that materials are aligned end-to-end, but rather are oriented in sufficient proximity to one another to allow alignment of the respective magnetic fields. Magnetically associated materials further do not require actual contact, so long as the magnetic fields are aligned.

As used herein, "repulsively associated" refers to magnetic materials which are oriented with common poles of neighboring materials toward one another. Thus, neighboring magnetic materials can be either magnetically associated or repulsively associated.

As used herein, "magnetically soft materials" refers to those materials which become temporary magnets when placed near permanent magnets or electric currents, but lose their magnetization when the permanent magnet or current is removed, e.g. diamagnetic and paramagnetic materials.

As used herein, "magnetic flux concentrator" refers to a material capable of concentrating and guiding magnetic field lines. The concentration may be due a number of factors such as, but not limited to, the type of the material and/or the geometry of the material. Generally, a material can be termed a magnetic flux concentrator if the material can increase the density of the magnetic field lines exiting the material; i.e. the material has a higher Gauss at the field exit surface as compared to the incoming surface(s). Gauss is measured in flux per square inch.

As used herein, "shunt" refers to a device or mechanism that interferes with magnetic field lines so as to decrease the magnetic field. For example, a shunt can be a magnetically soft material that can be spatially oriented at variable distances to a magnetic field generation system that can substantially affect the magnetic field strength of the system, or the shunt can be a material within a magnetic field strength generation system capable of affecting the magnetic field strength by a change in the material's properties, such as its magnetism, or orientation. Shunts can include moveable members, rotating members, electromagnets or any other material which can be used to interfere with or decrease the magnetic field strength.

As used herein, "symmetrically oriented" refers to an arrangement of members having a plane of symmetry. For example, given a central axis oriented normal to each flux surfaces of the flux concentrators at a central point on the flux surface, a plane of symmetry can be defined along which magnetic field lines are substantially symmetric on either side. All of the embodiments described herein exhibit such symmetric orientation of members and resulting field lines.

As used herein, "set" refers to a minimum of two members in a group. For example, a set of auxiliary permanent magnets has at least two permanent magnets in the set, although more than two members can also be present in a set.

As used herein, "high magnetic field saturation" means having a magnetic field saturation greater than conventional permanent magnet materials, e.g. Nd and/or Fe-containing materials. Most often high magnetic field saturation is greater than 1.3 Tesla, preferably greater than 1.8 Tesla, and most preferably greater than about 2.1 Tesla.

As used herein, "substantial" when used in reference to a quantity or amount of a material, or a specific characteristic thereof, refers to an amount that is sufficient to provide an effect that the material or characteristic was intended to provide. The exact degree of deviation allowable may in some cases depend on the specific context. Similarly, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

For example, when using "substantial" or "substantially" with the phrase "in contact with" regarding a magnetic field generation system, "substantial" or "substantially" refers to the ability to maintain a field strength between spaced materials, e.g. a gap or secondary material therebetween, of at least 90% of the field strength generated by direct contact. However, in one preferred embodiment, materials and members can be in direct physical contact with magnetically associated members.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "preferably" is non-exclusive and is intended to mean "preferably, but not limited to." Any steps recited in any method or process claims may be executed in any order and are not necessarily limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 micron to about 5 microns" should be interpreted to include not only the explicitly recited values of about 1 micron to about 5 microns, but also include individual values and sub-ranges within the indicated range. Thus, included in this numerical range are individual values such as 2, 3, and 4 and sub-ranges such as from 1-3, from 2-4, and from 3-5, etc.

This same principle applies to ranges reciting only one numerical value. Furthermore, such an interpretation should apply regardless of the breadth of the range or the characteristics being described.

The Invention

The present invention provides methods and systems for obtaining high magnetic fields while maintaining portability. Currently, permanent magnet technology can provide magnetic field strengths of just over 1 Tesla. Generally, existing permanent magnet devices utilize either the poles of the magnets or single ferromagnetic structures to guide the flux. However, the present invention provides methods and systems of generating higher field strengths than existing devices as well as methods and systems for varying the field without a required current or external power source. The following description provides specific details regarding the present invention and can be used in both methods and systems as described herein.

Figure 2:
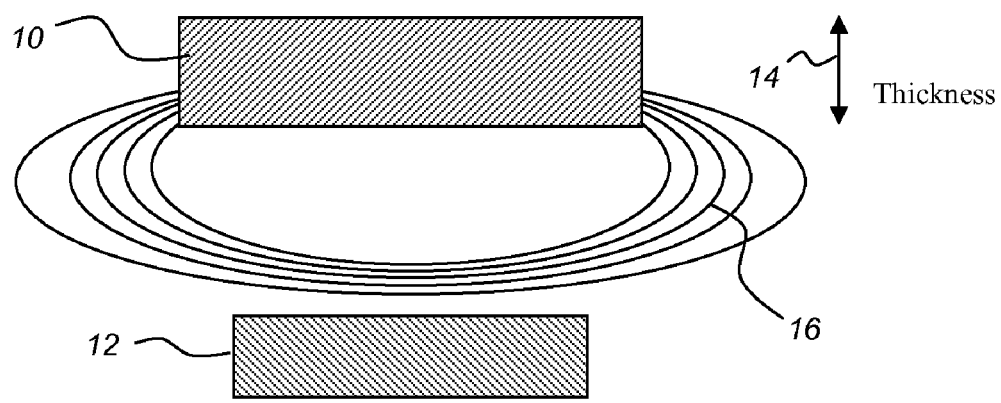
FIG. 2 shows a side view of a bar magnet in proximity to a magnetically soft ferromagnetic material in accordance with known magnetic principles.

As shown in FIG. 1, field lines 16 from a single bar magnet 10 can be represented with ellipsoidal lines leaving one end and entering the other, creating a magnetic dipole. If a piece of ferromagnetic material 12 is brought near this bar magnet, the flux lines 16 will alter their path so as to polarize the ferromagnetic material as depicted in FIG. 2.

Surprisingly, this concept can be advantageously applied in one embodiment of the present invention. The magnetic field can be quantified as a flux density typically measured in Gauss. FIG. 2 shows the thickness 14 of the bar magnet 10. A ferromagnetic material 12 can be brought in proximity to bar magnet 10 such that the magnetic field lines 16 are diverted. Generally, if the thickness 14 is reduced, then the same number of flux lines must fit through a smaller region, thus increasing the flux density (magnetic field). However, there is a limit to this magnetic field increase by shrinking the dimension, which is dictated by the hysteresis curve of the material.

Figure 3:
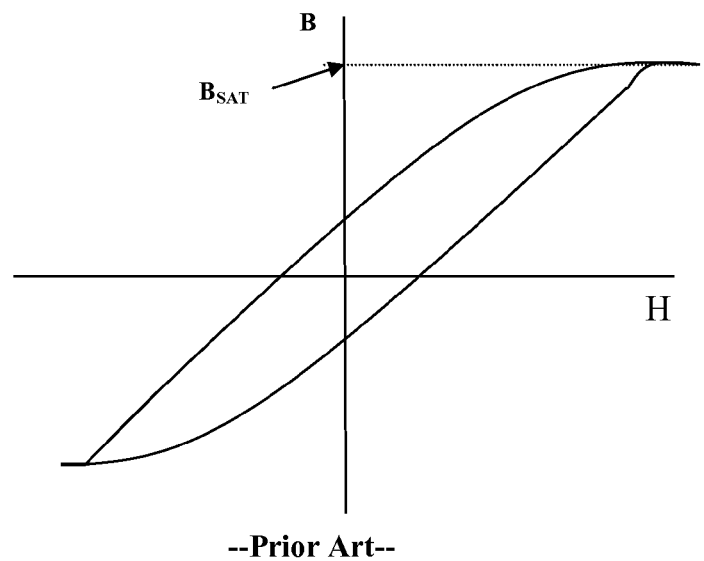
FIG. 3 shows a magnetic hysteresis loop describing the saturation of a ferromagnetic material in accordance with known principles.

A typical soft ferromagnetic material hysteresis curve is shown in FIG. 3 having a magnetic saturation $B_{sat}$.

Existing permanent magnet field generators are capable of just over 1 Tesla (approximately 1.3 Tesla). The present invention is capable of producing much higher magnetic field strengths. Methods and systems used herein can provide magnetic field strengths of over 2 Tesla utilizing materials such as pure iron, carbon steel or vanadium permendur. These materials can be obtained and machined to form the structures described herein. FIGS. 4-10 provide detailed descriptions and processes in accordance with various embodiments of the present invention for generating a very high magnetic field and varying that field.

Figure 4:
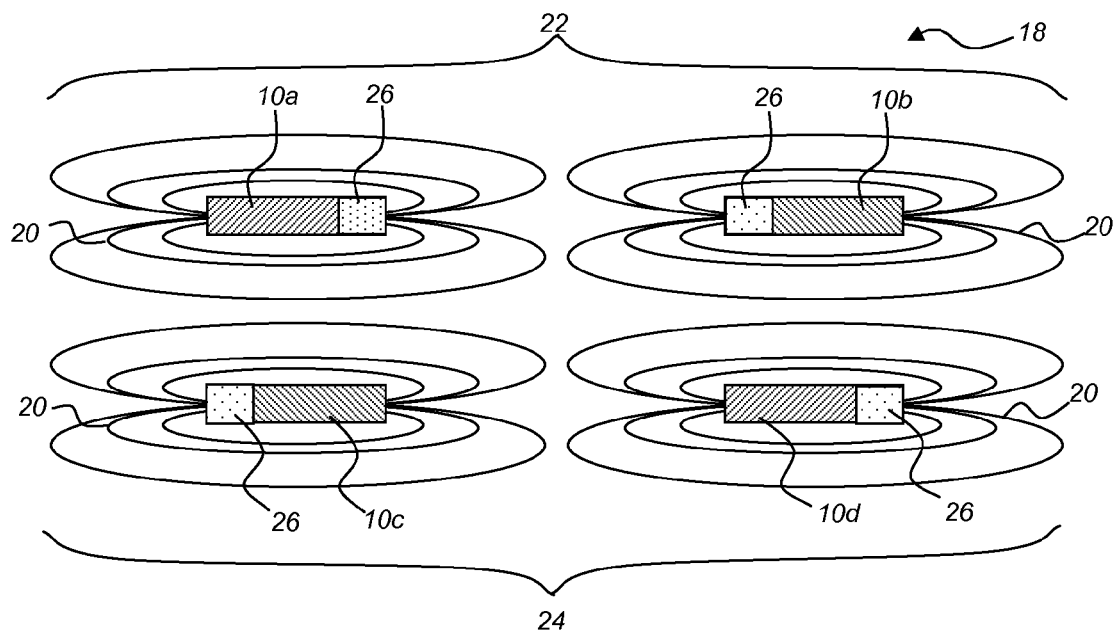
FIG. 4 shows four bar magnets positioned in the device without the magnetic flux concentrators that guide and concentrate the flux lines in accordance with an embodiment of the present invention.

FIG. 4 depicts a typical pole configuration 18 that can be used in the present invention. Specifically, FIG. 4 has two sets of permanent magnets 22, 24 each containing two bar magnets 10a, 10b, 10c and 10d with a square 26 indicating a north pole for each magnet. The configuration shows a repulsive orientation between members of each set, i.e. magnets 10a and 10b of set 22 are oriented with facing north poles, while magnets 10c and 10d of set 24 are oriented with facing south poles. Although the orientation can be configured with north poles facing toward each other in the top set and facing away from each other in the bottom set, a similar configuration having the south poles facing toward each other in the top set and facing away from each other in the bottom set is also contemplated by the present invention. In one embodiment, a set of magnets can contain a single magnet repulsively oriented with a plurality of magnets magnetically associated with each other, such that the plurality of magnets acts as a single magnet. The present invention contemplates the use of a set of single magnets or plurality of magnets as long as the set contains at least one magnet repulsively associated with another magnet within the set. Generally, the sets of auxiliary magnets can be permanently fixed in position relative to one another. In one optional embodiment, the sets of auxiliary magnets can be substantially fixed to allow slight movement and/or can include mechanisms to allow disassembly of the device.

Figure 5:
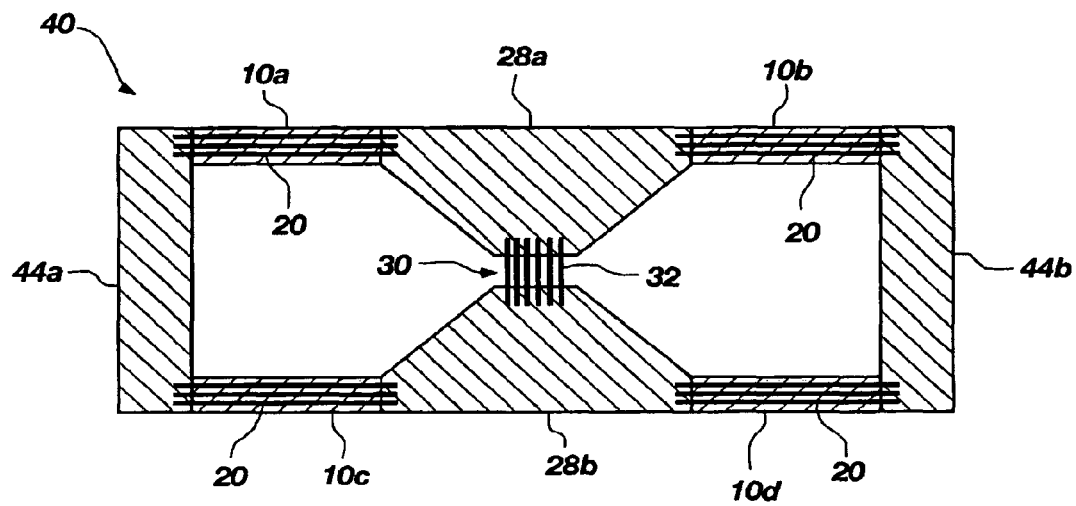
FIG. 5 shows a simplified drawing of a graphical representation of one embodiment of the present invention illustrating the addition of magnetic flux concentrators.

FIG. 5 shows the flux lines 20 from four bar magnets 10a-d after the magnetic flux concentrators 28 are added to the device 40 forming a sample volume 30. The present configuration allows an equivalent vertical magnetic dipole 32 to be formed such that the magnetic fields from the auxiliary permanent magnets (e.g. 10a and 10b) are added through the magnetic flux concentrators 28. The auxiliary permanent magnets 10 can be any suitable permanent magnet having a sufficiently strong magnetic field 20 to contribute to the concentration of flux 32 across the sample volume 30. Non-limiting examples of suitable permanent magnet material can include Nd—Fe—B, Sm—Co, Ce—Cu—Co, Mn—Bi, Ba—Fe—O, and alloys or combinations thereof. It is understood that these materials are not stoichiometrically complete, e.g. Sm—Co can include $SmCo_5$ and $Sm_2Co_{17}$, Nd—Fe—B is most often $Nd_2Fe_{14}B$, etc. Currently preferred permanent magnet materials are those based on rare earth elements. Generally, the magnetic flux concentrators 28 can comprise magnetically soft material, although the present invention contemplates the use of any material capable of concentrating magnetic field lines. Preferred magnetically soft materials include ferromagnetic materials. The magnetic flux concentrators can be formed of materials such as, but not limited to, vanadium permendur (49Fe-49Co-2V alloy), substantially pure iron, carbon steel, Ni—Fe alloys such as permalloy (80Ni-20Fe alloy), supermalloy (79Ni-16Fe-5Mo alloy), hymu (80Ni-15Fe-5Mo), and mumetal (75Ni-15Fe—Co—Mo), and composites, alloys or combinations of these materials. It is noted that compositions shown parentheses are approximate and may also include additional trace materials. Typically, the magnetic flux concentrators can be a material having a high magnetic field saturation. In one embodiment, the magnetic field saturation can be greater then 1.5 Tesla. In another embodiment, the magnetic field saturation can be greater than 1.8 Tesla. In yet another embodiment, the magnetic field saturation can be greater than 2.0 Tesla.

The four magnets 10 are magnetically associated through the magnetic flux concentrators 28 and through the support conduits 44. The support conduits can generally be formed of a magnetically soft material such as iron, nickel, and alloys or composites thereof, including materials which can be used for the magnetic flux concentrators. However, permanent magnets or even non-magnetizable materials could be used. The support conduits can provide mechanical support to the auxiliary magnets and can optionally contribute to the magnetic field and/or channeling of magnetic field as seen in FIGS. 7A, 7B, 8B and 8D.

In one embodiment, a magnetic field generation system can comprise first and second magnetic flux concentrators each spaced apart to form a sample volume. The first and second magnetic flux concentrators can be formed of a material having a magnetic field saturation. A first set of auxiliary permanent magnets can be symmetrically oriented about a portion of the first magnetic flux concentrator and can be in substantial contact with the first magnetic flux concentrator. Similarly, a second set of auxiliary permanent magnets can be symmetrically oriented about a portion of the second magnetic flux concentrator and can be in substantial contact with the second magnetic flux concentrator. In one embodiment, the first and second sets are in substantial equal contact with their respective first and second magnetic flux concentrators. Generally, the first set and second set of auxiliary permanent magnets can be remote from the sample volume. For example, each pair of auxiliary permanent magnets can be located above or below the sample space defined by the magnetic flux concentrators, as shown in FIG. 5. In one embodiment, the first and second magnetic flux concentrators are oriented substantially vertically such that a substantially horizontal sample volume is formed, where the first set of auxiliary permanent magnets are oriented above the first magnetic flux concentrator, and the second set of auxiliary permanent magnets are oriented below the second magnetic flux concentrator. Each of the first set and second set of auxiliary permanent magnets can be oriented in a magnetically repulsive orientation with respect to at least one other member of their respective sets. The orientation of the magnets individually, and as a set, can allow the magnets to be magnetically associated to each other via the first and second magnetic flux concentrators. Although the figures generally show, and the embodiments generally refer to single structures, it is to be understood that the present invention contemplates the use of a plurality of structures that are able to substantially function in their respective capacities as if they were a single unit. For example, one or more pieces of permendur or other material can be used to form a single "magnetic flux concentrator." This same principle applies to other components such as, but not limited to, support conduits, auxiliary magnets, shunts, and the like.

Figure 6:
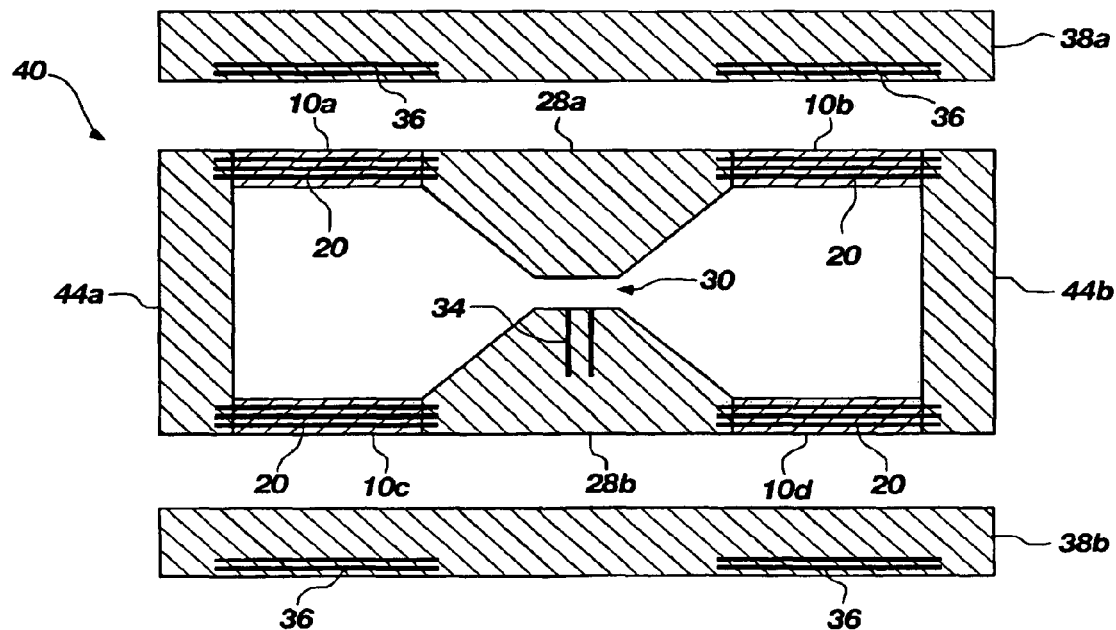
FIG. 6 illustrates the drawing of FIG. 5 having magnetically soft ferromagnetic material, acting as shunts, in proximity above and below the device in accordance with one embodiment of the present invention.
Figure 7:
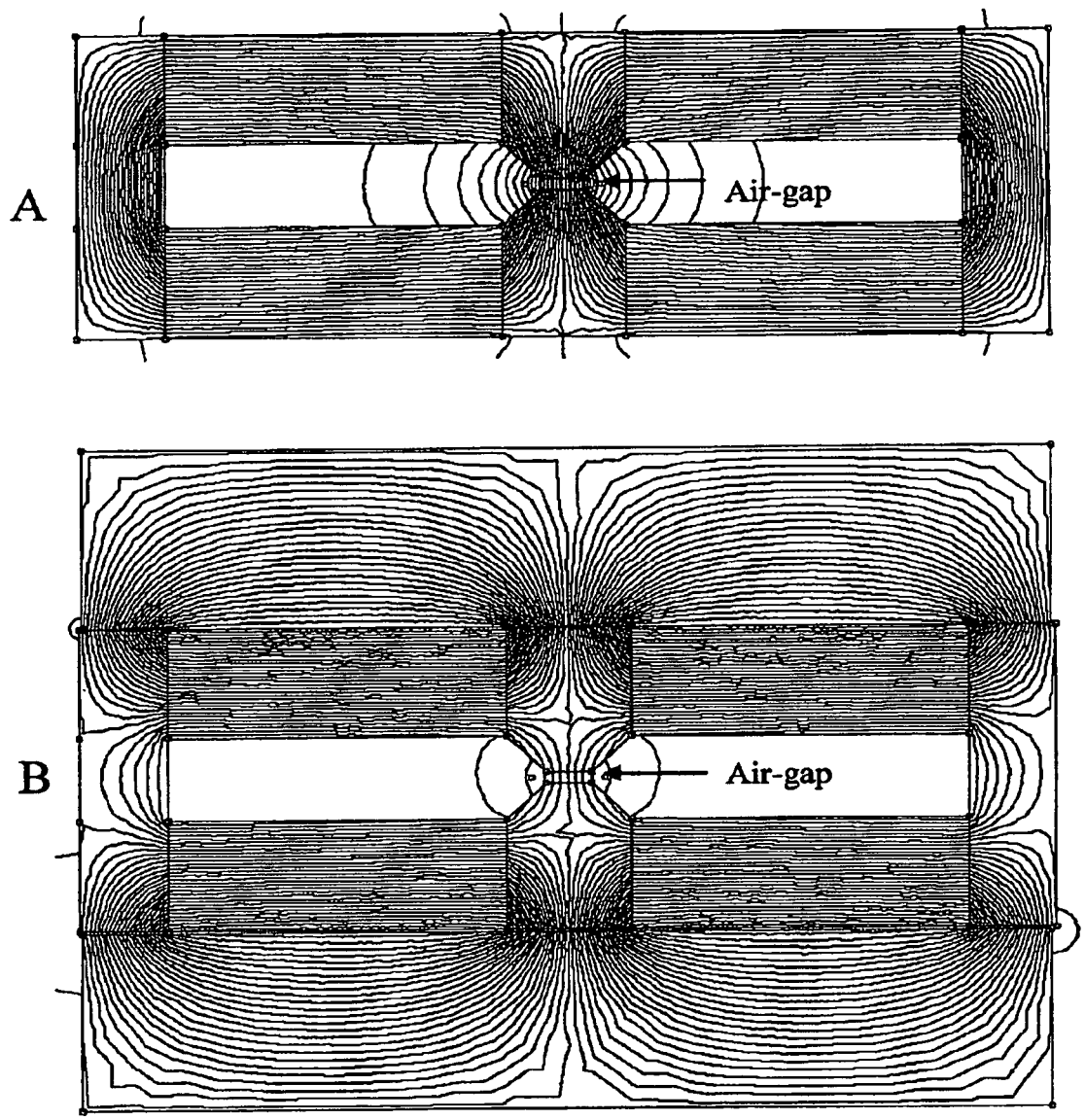
FIGS. 7A and 7B shows computer generated drawings of magnetic field lines associated with devices in accordance with embodiments of the present invention without and with shunts in proximity, respectively.

FIG. 6 shows the addition of shunts 38 to vary the magnetic field strength across the magnetic flux concentrators 28a and 28b. The shunts are preferably magnetically soft materials and are generally ferromagnetic. When additional ferromagnetic features, i.e. shunts 38, are brought near the device 40, some of the flux lines 34 are re-routed from the sample volume 30, thus reducing the field strength through the magnetic flux concentrators 28a and 28b and within the sample volume 30. Adjusting a gap 42 or distance between the main device 40 and the shunts 38, allows for a fine adjustment of the field strength across the sample volume 30 as the magnetic field lines 36 of the shunts 38 can variably re-rout magnetic field lines 20 of the main device.

More particularly, FIGS. 7A and 7B show computer generated field lines of a magnet device configuration with and without shunts as described by an embodiment of the present invention. Specifically, FIG. 7A shows two sets 22, 24 of magnets 10a through 10d configured in a repulsive orientation in the top set 22 and in the bottom set 24 having a magnetic field strength of 32 associated and concentrated through magnetic field concentrators 28 about a sample space 30. The magnets can have an NdFeB composition and can be contacted to and symmetrically spaced about a set of magnetic flux concentrators 28a and 28b, which can be made of vanadium permendur. However, other specific materials can also be suitable as discussed herein. This particular choice of materials can achieve a maximum field of approximately 2.35 Tesla, just under the theoretical saturation level of vanadium permendur. Thus, in accordance with the present invention, the maximum achievable field strength is substantially only limited by the magnetic saturation of the flux concentrators. Additional shunts can be structurally connected to the system such that the distance between the system and the shunts can be carefully controlled. Various actuators or other mechanical systems can be used for this purpose. As shown in FIG. 7B, shunts 38 can be placed above and below such a device. In one embodiment, varying the distance of the shunts from the device can vary the magnetic field strength from about 400 Gauss to about 24,000 Gauss. The sample volume 30 can experience a dramatic variance in field strength under each condition, as shown by magnetic field lines 32 in 7A and 46 in 7B.

Generally, shunts can be used in any of the systems and methods of the present invention. In one embodiment, a first and second shunt of magnetically soft material can each be moveably oriented above and below the first and second magnetic flux concentrators, respectively. The first and second shunt can create a first and second distance, respectively, that can be varied to effect a change in magnetic field strength across the sample volume. The variable shunts can vary the field strength from about 3,000 to about 23,000 Gauss. In one embodiment, at least one shunt can be used to vary the to magnetic field strength. The shunts can comprise various geometries and can be employed through various mechanisms. For example, a shunt can comprise an electromagnetic material that is substantially fixed to the magnetic field generation system, which is capable of varying the magnetic field of the system by inducing magnetic fields in the shunt. Additionally, the shunt can comprise a permanent magnet or set of permanent magnets that has a relatively fixed distance to the sample volume, but can be moved in various distances with respect to the sets of auxiliary magnets such that various magnetic field changes can be obtained. In one embodiment, the shunts can be rotated about the system. In another embodiment, the shunts can be rotated within the system. For example, the shunts can be rotatable about a suitable axis such that the shunt rotates to a position which achieves a desired effect on the field strength of the device. Alternatively, the shunt can be slidably oriented such that the shunt can be slid to effect a change in the magnetic fields through the device. In yet another embodiment, the shunts can be rotatably hinged members as discussed in connection with FIGS. 8 and 10. Actual direct contact of the shunt flush with the flux concentrator and/or other members can essentially lock the shunt in place requiring excessive force in order to pull the shunt away. In order to prevent such shunt lock, springs or other materials (not shown) can be placed between the shunt and the flux concentrator or other member sufficient to prevent flush contact and/or to smooth movement of the shunt.

Figure 8A:
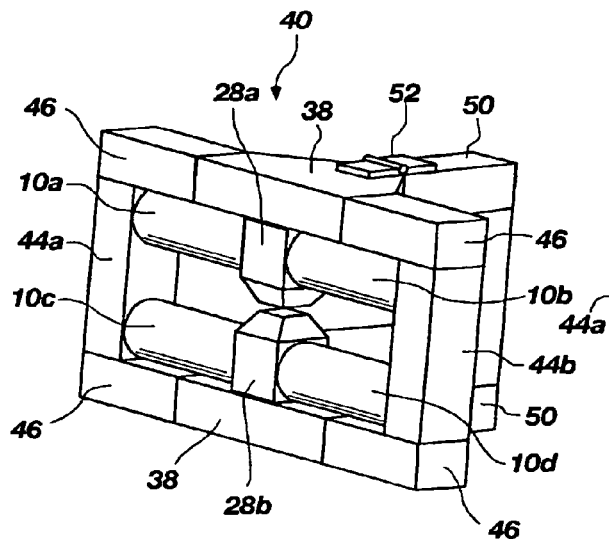
FIG. 8A is a drawing of a magnetic device having shunts in a closed position in accordance with one embodiment of the present invention.
Figure 8B:
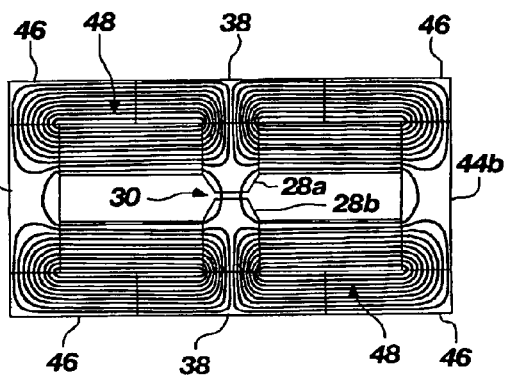
FIG. 8B illustrates the magnetic field lines associated with the device of FIG. 8A.
Figure 8C:
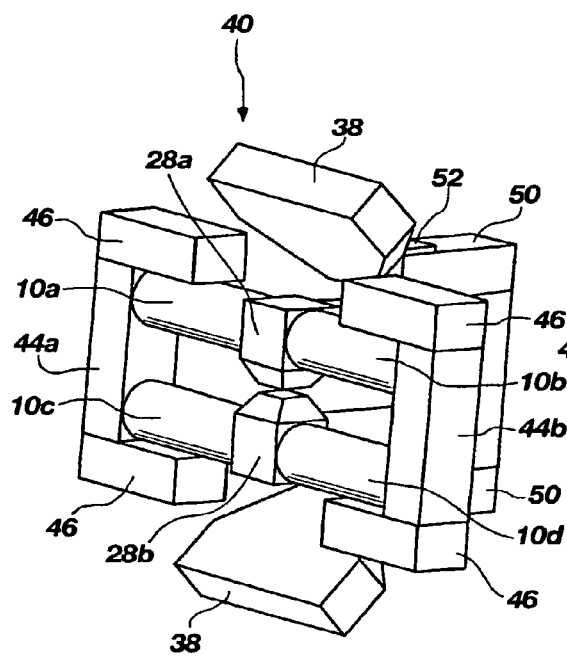
FIG. 8C is a drawing of the magnetic device of FIG. 8A having shunts in an open position in accordance with one embodiment of the present invention.
Figure 8D:
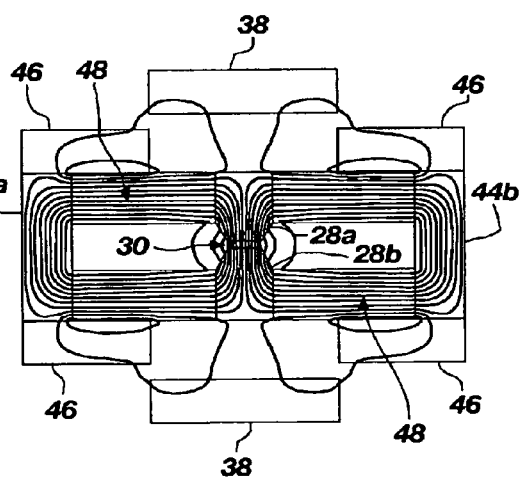
FIG. 8D illustrates the magnetic field lines associated with the open-position device of FIG. 8C.
Figure 9:
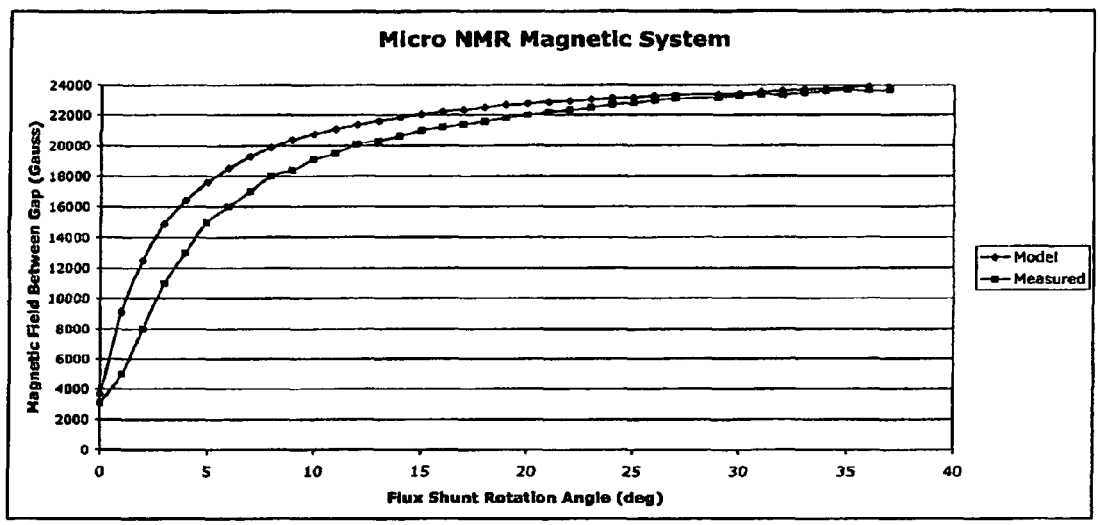
FIG. 9 is a graph of magnetic field strength as a function of rotation angle of a shunt in accordance with one embodiment of the present invention.

FIGS. 8A through 8D illustrate embodiments of the present invention having shunts oriented above and below the system. Specifically, FIGS. 8A and 8B illustrate the device in a low magnetic field position where the shunts 38 are closely associated with the device 40. The shunts reroute the magnetic field lines 48 from the magnetic flux concentrators 28 significantly decreasing the magnetic filed strength from the sample volume 30. The device 40 can contain four auxiliary magnets 10 repulsively oriented such that they can be associated through magnetic flux concentrators 28 and magnetically conductive material 44, 46 creating a high magnetic field across sample volume 30. The shunts 38 are connected to a support structure 50 and can be rotated at various angles using hinge 52. FIGS. 8C and 8D illustrate the device in a high field position where the shunts 38 are remote from the flux concentrators and do not substantially affect the field strength 32 across the sample volume 30. Although FIGS. 8A and 8C show a six magnet configuration, a similar device can be constructed using support structures in lieu of the fifth and sixth magnets as shown. FIG. 9 shows a graph of magnetic strength versus shunt rotation angle away from the embodiment illustrated in FIGS. 8A and 8C. As can be seen, a rather steep increase in field strength is observed during the first 5-10° of rotation with a more moderate and gradual increase is the shunt is rotated to about 37°. In applications where finer control is desired across the entire operating variation of field strength, additional actuators or configurations can be used. For example, fine control actuators having micron distance control could be used to move the shunts. In addition, or alternatively, the shunts can be designed to slide and/or move independently in order to provide finer control at lower field strengths.

Additionally, space between the first and second sets of permanent magnets can generally be open space. However, optional diamagnetic solids can be placed in this interior space. Such material can be useful in providing additional support to maintain the space between the magnetic flux concentrators.

Figure 10:
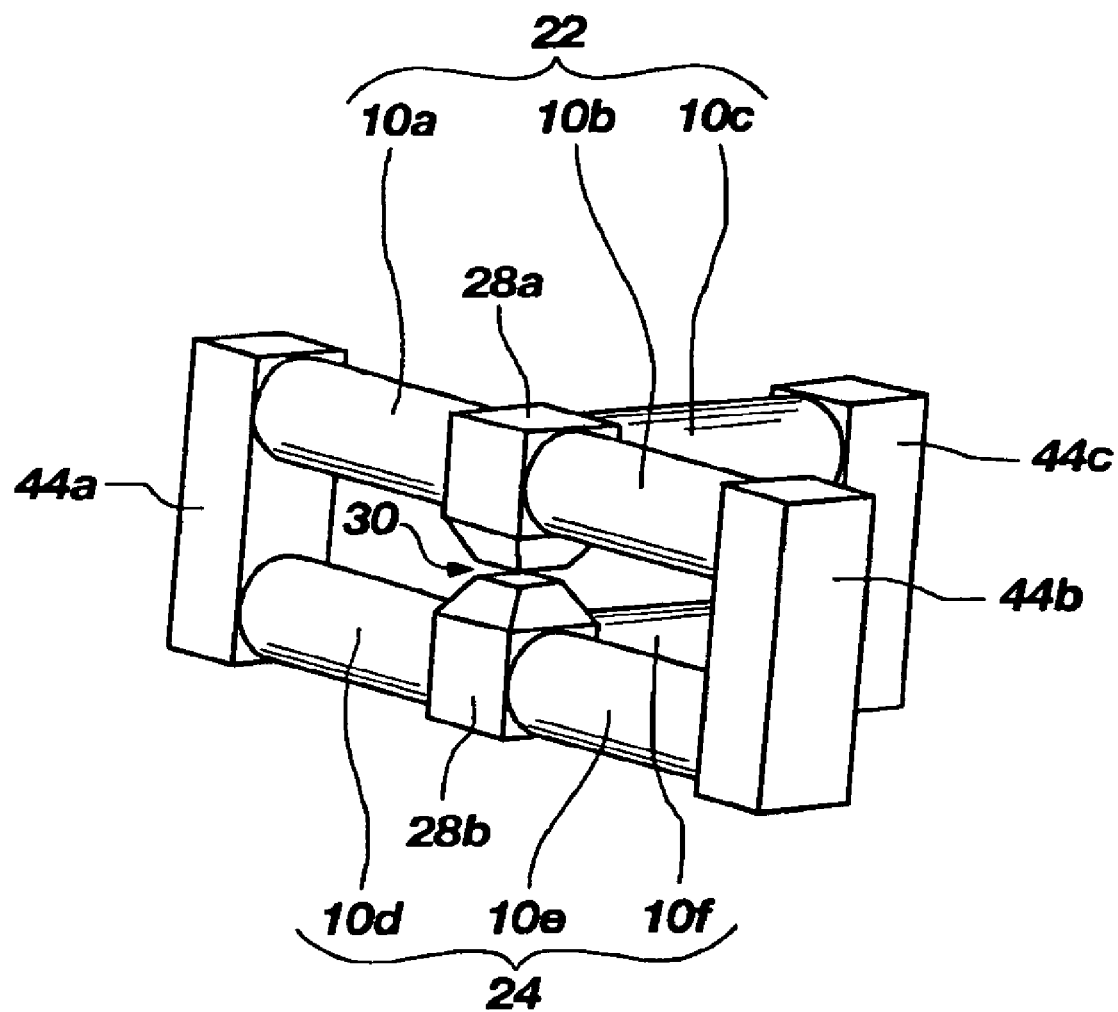
FIG. 10 is a perspective view of a device having two sets of three auxiliary magnets in accordance with one embodiment of the present invention.

FIG. 10 illustrates an additional optional embodiment having three permanent magnets 10a,b,c and 10d,e,f on each of the first 22 and second 24 auxiliary magnet sets, respectively. In this figure, the third magnets 10c and 10f extend into the page such that a top view would appear as a "T." Four or more auxiliary magnets can be similarly oriented. The magnets are oriented such that the magnetic field lines can be concentrated across the sample volume 30 through the flux concentrators 28. In one embodiment, the third magnet can be approximately oriented at a 90° angle to the first and second magnet. The third magnet would be repulsively oriented to at least one other member of the set. Such an arrangement would allow an increased magnetic field strength across the magnetic flux concentrators. The desirability of such additional permanent magnets can depend on the materials used for each of the auxiliary magnets, the flux concentrators, and the desired maximum field strength.

Figure 11:
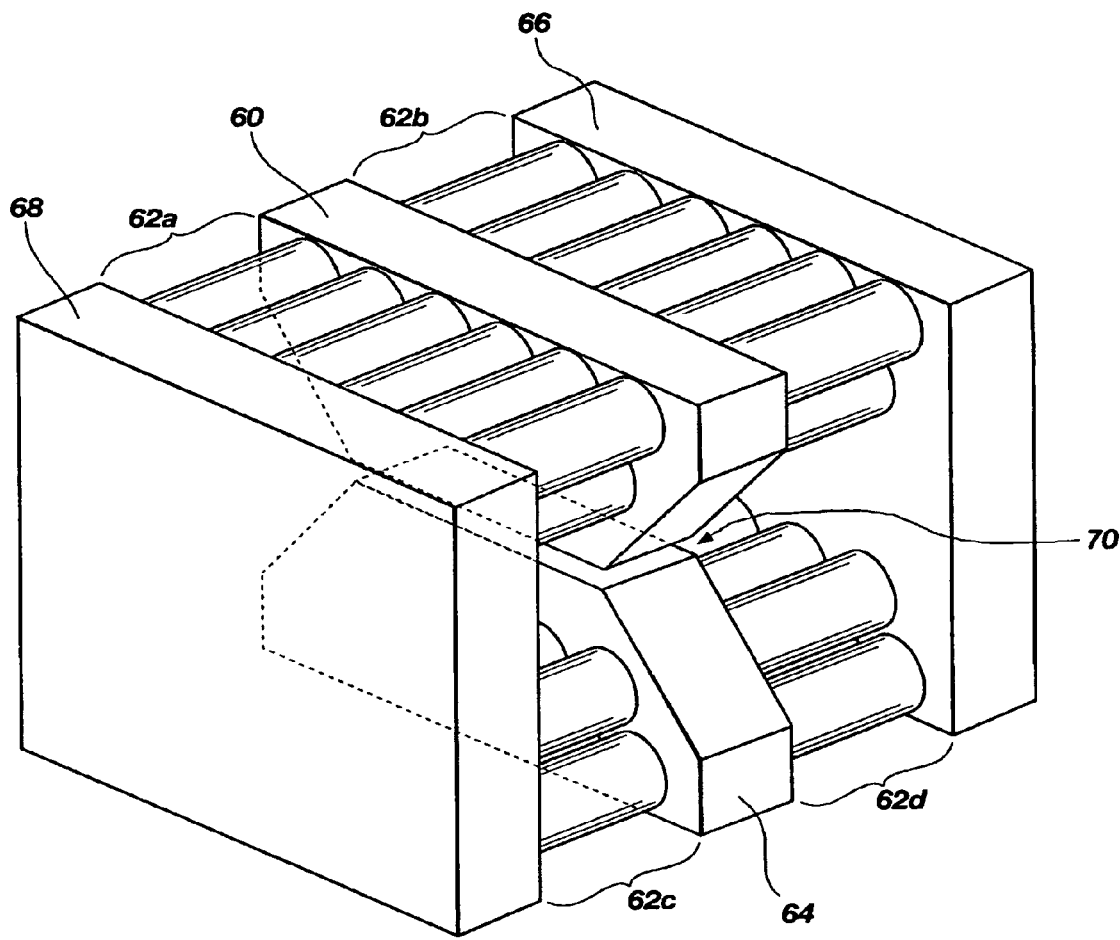
FIG. 11 is a perspective view of a device having multiple permanent magnets oriented along opposing sides of each of two elongated flux concentrators in accordance with another alternative embodiment of the present invention.

As further illustrated in FIG. 11, a plurality of permanent magnets can be used as each member of the respective sets. Specifically, additional permanent magnets can increase the number of field lines through the respective flux concentrators. However, the contribution that each additional permanent magnet provides can depend on the materials. Generally, for a given materials the first two to three additional permanent magnets can be additive or nearly additive, while later additional magnets contribute less. This is primarily a function of the material used as the flux concentrator and the respective hysteresis curve (i.e. B-H curve). Each addition will move the net field strength and flux density up the curve such that as the field strength approaches saturation, the corresponding increase in H and B is less.

FIG. 11 illustrates a first magnetic flux concentrator 60 having a set of twenty-two cylindrical permanent magnets symmetrically oriented about the concentrator. A first group of eleven permanent magnets 62a is oriented in a magnetically repulsive orientation to a second group of eleven permanent magnets 62b. Each of the eleven permanent magnets in each group is magnetically oriented in the same direction. A similar arrangement of groups of permanent magnets 62c and 62d can be oriented about a second magnetic flux concentrator 64 with the permanent magnets having their magnetic poles reversed from those of the first set, i.e. magnetically repulsive orientation with respect to the respective first group 62a and second group 62b. As in other embodiments, magnetically soft support conduits 66 and 68 can provide spacing support between the two sets of permanent magnets and respective flux concentrators.

The configuration described with respect to FIG. 11 has an additional benefit of widening the flux density curve to allow for more uniform flux density across the sample volume 70. Specifically, the flux density tends to be non-uniform having a peak toward the center and dropping off toward the edges of flux surfaces. As in FIG. 11, the flux surfaces can be extended in one or more dimensions in order to increase the volume over which the flux density can be kept more uniform.

Alternatively, or in addition to the above geometry adjustments, flux surfaces of the flux concentrators can be contoured in order to shape the field lines across the sample volume or open space. Specifically, magnetic field lines tend to leave a surface into open space at approximately a 90° angle. Therefore, the flux surface can be contoured in order to achieve a uniform or nearly uniform flux density across the surface and between the two flux surfaces. For example, the flux surfaces can be polished and/or curved, e.g. a rounded concave contour, sufficient to achieve the desired flux density and profile within a sample volume or region of interest.

In accordance with another alternative embodiment, a shunt can be oriented so as to cover substantially all of the top and bottom portions of the permanent magnets, flux concentrators and support conduits. For example, two hinged shunts can be formed over top and bottom of the device shown in FIG. 11 so as to substantially cover top and bottom portions of the device.

In yet another optional embodiment, an electromagnetic coil can be oriented about the sample volume or void space between the magnetic flux concentrators. This addition of a supplemental magnetic field can provide a relatively small order magnetic field variation while the shunts and/or permanent magnets provide a larger order magnetic field variation.

The entire device can optionally be housed in a housing which is preferably an interference shield, e.g. shields from rf or other electromagnetic waves which could interfere with subtle signal changes. For example, an aluminum housing can be formed about the entire device as an interference shield.

Thus, the present invention utilizes flux path altering and concentrating to produce a variable magnetic field generator. Additionally, the present invention provides permanent magnet structures having field strengths up to about 2.4 Tesla, although the actual achievable maximum field strength is substantially only limited by the magnetic saturation of the flux concentrators. The devices of the present invention can be particularly suited for use in portable magnetic resonance spectroscopy and in any application requiring a static magnetic field, i.e. semiconductor characterization, communications applications, traveling wave ultra high frequency tubes, and the like. Further, the systems of the present invention allow for much more sensitive measurement of RF responses of materials placed in the sample volume. Another potential application of the systems of the present invention include Hall Effect measurement of semiconductor materials. In addition, the systems of the present invention offer variable field strength adjustment across a large range of field strength. This can provide convenient measurement of properties as a function of field strength across a large range and/or as a function of time (e.g. rate of change in field strength) using a relatively simple system.

The present invention can be integrated with other materials and elements to form a nuclear magnetic resonance (NMR) device or magnetic resonance imaging (MRI) device. In one embodiment, the magnetic field generation system can further include a field lock, shim coils, sample probe, gradient coils, quadrature detector, digital filtering device, or combinations thereof operatively connected to the system. In another embodiment, the sample volume includes a sample probe for NMR testing.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A magnetic field generation system, comprising:
   a) first and second magnetic flux concentrators each spaced apart to form a sample volume, said first and second magnetic flux concentrators having a magnetic field saturation;
   b) a first set of auxiliary permanent magnets symmetrically oriented about a portion of the first magnetic flux concentrator and in substantial contact with the first magnetic flux concentrator, said first set of auxiliary permanent magnets remote from the sample volume, and each of the first set of auxiliary permanent magnets oriented in a magnetically repulsive orientation with respect to at least one other member of the first set of auxiliary permanent magnets; and
   c) a second set of auxiliary permanent magnets symmetrically oriented about a portion of the second magnetic flux concentrator and in substantial contact with the second magnetic flux concentrator, said second set of auxiliary permanent magnets remote from the sample volume, and each of the second set of auxiliary permanent magnets oriented in a magnetically repulsive orientation with respect to at least one other member of the second set of auxiliary permanent magnets and magnetically associated to the first set of auxiliary permanent magnets via the first and second magnetic flux concentrators;
   d) a field lock, shim coils, sample probe, gradient coils, quadrature detector, digital filtering device, or combinations thereof operatively connected to the system; and
   e) a first and a second magnetically soft shunt each movably oriented above and below the first and second magnetic flux concentrators respectively such that a first distance between each of the first magnetically soft shunt and the first magnetic flux concentrator, and second distance between each of the second magnetically soft shunt and the second magnetic flux concentrator can be varied to effect a change in magnetic field strength across the sample volume.

2. The system of claim 1, wherein said magnetic flux concentrators comprise a high magnetic field saturation material.

3. The system of claim 2, wherein the magnetic field saturation is greater than 1.8 Tesla.

4. The system of claim 2, wherein the magnetic flux concentrators comprise a vanadium-cobalt-iron alloy, carbon steel, or substantially pure iron.

5. The system of claim 1, wherein the first and second magnetic flux concentrators are oriented substantially vertically such that a substantially horizontal sample volume is formed, said first set of auxiliary permanent magnets being oriented above the first magnetic flux concentrator, and said second set of auxiliary permanent magnets being oriented below the second magnetic flux concentrator.

6. The system of claim 1, wherein at least one of the first and second set of auxiliary permanent magnets include a plurality of permanent magnets oriented in the same magnetic direction.

7. The system of claim 1, wherein the first and second magnetic flux concentrators include a contoured flux surface configured to increase flux density uniformity across the sample volume.

8. The system of claim 1, further comprising an electromagnet oriented about the sample volume.

9. A method of forming a high magnetic field, comprising:
   a) orienting a first and second magnetic flux concentrator spaced apart to form a sample volume;
   b) repulsively associating a first set of auxiliary permanent magnets by positioning the first set of auxiliary permanent magnets symmetrically about a portion of the first magnetic flux concentrator, said first set of auxiliary permanent magnets remotely positioned from the sample volume and having substantial contact with the first magnetic concentrator; and
   c) repulsively associating a second set of auxiliary permanent magnets by positioning the second set of auxiliary permanent magnets symmetrically about a portion of the second magnetic flux concentrator, said second set of auxiliary permanent magnets remotely positioned from the sample volume and having substantial contact with the second magnetic concentrator such that the first set of auxiliary permanent magnets and the second set of auxiliary permanent magnets are magnetically associated via the first and second magnetic flux concentrators, said sample volume having a magnetic field strength; and
   d) varying the magnetic field strenght by movably orienting a first and a second magnetically soft shunt above and below the first and second magnetic flux concentrators respectively such that a first distance between each of the first magnetically soft shunt and the first magnetic flux concentrator, and second distance between each of the second magnetically soft shunt and the second magnetic flux concentrator can be varied to effect a change in magnetic field strength across the sample volume.

10. The method of claim 9, wherein the magnetic field strength can be varied from about 3,000 to about 23,000 Gauss.

11. The method of claim 9, wherein said magnetic flux concentrators comprise a high magnetic field saturation material.

12. The method of claim 11, wherein the high magnetic field saturation material has a magnetic field saturation greater than 1.8 Tesla.

13. The method of claim 11, wherein the magnetic flux concentrators comprise a vanadium-cobalt-iron alloy or substantially pure iron.

14. The method of claim 9, wherein the first and second magnetic flux concentrators are oriented substantially vertically such that a substantially horizontal sample volume is formed, said first set of auxiliary permanent magnets being oriented above the first magnetic flux concentrator, and said second set of auxiliary permanent magnets being oriented below the second magnetic flux concentrator.

15. The method of claim 9, wherein at least one of the first and second set of auxiliary permanent magnets include a plurality of permanent magnets oriented in the same magnetic direction.

16. A variable magnetic field generation system, comprising:
   a) first and second magnetic flux concentrators each spaced apart to form a sample volume, said first and second magnetic flux concentrators having a magnetic field saturation;
   b) a first set of auxiliary permanent magnets symmetrically oriented about a portion of the first magnetic flux concentrator and in substantially contact with the first magnetic flux concentrator, said first set of auxiliary permanent magnets remote from the sample volume, and each of the first set of auxiliary permanent magnets oriented in a magnetically repulsive orientation with respect to at least one other member of the first set of auxiliary permanent magnets;
   c) a second set of auxiliary permanent magnets symmetrically oriented about a portion of the second magnetic flux concentrator and in substantially contact with the second magnetic flux concentrator, said second set of auxiliary permanent magnets remote from the sample volume, and each of the second set of auxiliary permanent magnets oriented in a magnetically repulsive orientation with respect to at least one other member of the second set of auxiliary permanent magnets and magnetically associated to the first set of auxiliary permanent magnets via the first and second magnetic flux concentrators; and
   d) a first and a second magnetically soft shunt each movably oriented above and below the first and second magnetic flux concentrators respectively such that a first distance between each of the first magnetically soft shunt and the first magnetic flux concentrator, and second distance between each of the second magnetically soft shunt and the second magnetic flux concentrator can be varied to effect a change in magnetic field strength across the sample volume.

17. The system of claim 16, wherein the first and second magnetic flux concentrators are formed of vanadium permendur, carbon steel, or substantially pure iron.

18. The system of claim 16, wherein the first and second set of auxiliary permanent magnets are formed of Nd—Fe—B.

\* \* \* \* \*

UNITED STATES PATENT AND TRADEMARK OFFICE
CERTIFICATE OF CORRECTION

Page 1 of 1

PATENT NO. : 8,395,468 B2
APPLICATION NO. : 12/159927
DATED : March 12, 2013
INVENTOR(S) : James C. Stephenson, Bruce K. Gale and Cynthia Furse It is certified that error appears in the above-identified patent and that said Letters Patent is hereby corrected as shown below:

In the Specification,

Column 1, line 9, Add:

--GOVERNMENT INTEREST

This invention was made with government support under DGE9987616 awarded by National Science Foundation. The government has certain rights in this invention.--

Signed and Sealed this
Thirty-first Day of March, 2015

Michelle K. Lee
*Director of the United States Patent and Trademark Office*